(12) United States Patent
Lyon (10) Patent No.: US 12,495,513 B2
(45) Date of Patent: *Dec. 9, 2025

(54) FLUID HEAT EXCHANGER CONFIGURED TO PROVIDE A SPLIT FLOW

(71) Applicant: CoolIT Systems, Inc., Calgary (CA)

(72) Inventor: Geoff Sean Lyon, Calgary (CA)

(73) Assignee: CoolIT Systems, Inc., Calgary (CA)

( * ) Notice: Subject to any disclaimer, the term of this patent is extended or adjusted under 35 U.S.C. 154(b) by 0 days.

This patent is subject to a terminal disclaimer.

(21) Appl. No.: 17/079,225

(22) Filed: Oct. 23, 2020

(65) Prior Publication Data

US 2021/0045262 A1 Feb. 11, 2021

Related U.S. Application Data

(63) Continuation of application No. 15/462,753, filed on Mar. 17, 2017, now Pat. No. 12,101,906, which is a
(Continued)

(51) Int. Cl.
*H01L 23/473* (2006.01)
*F28D 15/00* (2006.01)
(Continued)

(52) U.S. Cl.
CPC .............. *H05K 7/20* (2013.01); *F28D 15/00* (2013.01); *F28F 3/00* (2013.01); *H01L 23/473* (2013.01);
(Continued)

(58) Field of Classification Search
CPC ........... H05K 7/20218; H05K 7/20254; H05K 7/20263; H05K 7/20272; H01L 23/4735
See application file for complete search history.

(56) References Cited

U.S. PATENT DOCUMENTS

| 3,073,385 A | 1/1963 | Martin |
| 3,481,393 A | 12/1969 | Chu |

(Continued)

FOREIGN PATENT DOCUMENTS

| AU | 2002351567 A1 | 7/2003 |
| CN | 2562368 Y | 7/2003 |

(Continued)

OTHER PUBLICATIONS

Translation of JP2005123496A entitled Translation-JP2005123496A (Year: 2023).*

(Continued)

*Primary Examiner* — Paul Alvare
(74) *Attorney, Agent, or Firm* — WORKMAN NYDEGGER (57) ABSTRACT

A fluid heat exchanger for cooling an electronic device can have a plurality of walls. The walls can define a corresponding plurality of microchannels. Each microchannel can extend from a first end to a second end. The plurality of microchannels can define at least two opposed outer microchannels and a centrally located microchannel positioned between the opposed outer microchannels. A fluid inlet passage can be configured to deliver a heat-exchange fluid to each microchannel between the corresponding first end and the corresponding second end of the respective microchannel. A fluid outlet passage can have an enlarged outlet region from the centrally located microchannel compared to a corresponding outlet region from one or both of the opposed outer microchannels. Related methods are disclosed.

9 Claims, 2 Drawing Sheets

Related U.S. Application Data continuation of application No. 14/283,163, filed on May 20, 2014, now Pat. No. 9,603,284, which is a continuation of application No. 12/189,476, filed on Aug. 11, 2008, now Pat. No. 8,746,330.

(60) Provisional application No. 60/954,987, filed on Aug. 9, 2007.

(51) Int. Cl.
*F28F 3/00* (2006.01)
*H05K 7/20* (2006.01)

(52) U.S. Cl.
CPC ...... *H05K 7/20254* (2013.01); *F28F 2260/02* (2013.01); *H01L 2924/0002* (2013.01); *H05K 7/20218* (2013.01); *H05K 7/20263* (2013.01)

(56) References Cited

U.S. PATENT DOCUMENTS

| | | | |
|---|---|---|---|
| 3,817,321 A * | 6/1974 | Von Cube | H01L 23/427 165/170 |
| 3,861,826 A | 1/1975 | Dean, Jr. | |
| 4,139,330 A | 2/1979 | Neal | |
| 4,345,643 A * | 8/1982 | Dawson | F28F 3/12 165/170 |
| 4,450,472 A | 5/1984 | Tuckerman et al. | |
| 4,561,040 A | 12/1985 | Eastman et al. | |
| 4,563,620 A | 1/1986 | Komatsu | |
| 4,564,040 A | 1/1986 | Rudelick | |
| 4,750,086 A | 6/1988 | Mittal | |
| 4,758,926 A | 7/1988 | Herrell et al. | |
| 4,768,581 A | 9/1988 | Gotwald et al. | |
| 4,898,153 A | 2/1990 | Sherwood | |
| 4,909,315 A | 3/1990 | Nelson et al. | |
| 4,940,085 A | 7/1990 | Nelson et al. | |
| 5,016,090 A | 5/1991 | Galyon | |
| 5,070,936 A | 12/1991 | Carroll | |
| 5,099,311 A | 3/1992 | Bonde et al. | |
| 5,203,401 A | 4/1993 | Hamburgen et al. | |
| 5,218,515 A | 6/1993 | Bernhardt | |
| 5,265,670 A | 11/1993 | Zingher | |
| 5,277,232 A | 1/1994 | Borsheim | |
| 5,294,830 A | 3/1994 | Young et al. | |
| 5,309,319 A | 5/1994 | Messina | |
| 5,434,491 A | 7/1995 | Marioni | |
| 5,441,102 A | 8/1995 | Burward-Hoy | |
| 5,453,641 A | 9/1995 | Mundinger et al. | |
| 5,535,818 A | 7/1996 | Fujisaki et al. | |
| 5,592,363 A | 1/1997 | Atarashi et al. | |
| 5,646,824 A | 7/1997 | Ohashi et al. | |
| 5,684,671 A | 11/1997 | Hobbs et al. | |
| 5,727,618 A | 3/1998 | Mundinger et al. | |
| 5,731,954 A | 3/1998 | Cheon | |
| 5,764,483 A | 6/1998 | Ohashi et al. | |
| 5,823,249 A | 10/1998 | Batchelder | |
| 5,835,347 A | 11/1998 | Chu | |
| 5,841,634 A | 11/1998 | Visser | |
| 5,864,464 A | 1/1999 | Lin | |
| 5,875,637 A | 3/1999 | Paetow | |
| 5,998,240 A | 12/1999 | Hamilton et al. | |
| 6,014,312 A | 1/2000 | Schulz-Harder et al. | |
| 6,019,165 A | 2/2000 | Batchelder | |
| 6,035,655 A | 3/2000 | Hare et al. | |
| 6,166,907 A | 12/2000 | Chien | |
| 6,256,378 B1 | 7/2001 | Iggulden et al. | |
| 6,263,957 B1 | 7/2001 | Chen et al. | |
| 6,327,145 B1 | 12/2001 | Lian et al. | |
| 6,330,525 B1 | 12/2001 | Hays et al. | |
| 6,361,287 B1 | 3/2002 | Hopper | |
| 6,408,937 B1 | 6/2002 | Roy | |
| 6,415,853 B1 | 7/2002 | Tao et al. | |
| 6,415,860 B1 | 7/2002 | Kelly et al. | |
| 6,422,304 B1 | 7/2002 | Slovikosky | |
| 6,447,270 B1 | 9/2002 | Schmidt et al. |
| 6,470,289 B1 | 10/2002 | Peters et al. |
| 6,679,315 B2 | 1/2004 | Cosley et al. |
| 6,702,002 B2 | 3/2004 | Wang |
| 6,748,755 B2 | 6/2004 | Kubo et al. |
| 6,769,258 B2 | 8/2004 | Pierson |
| 6,792,373 B2 | 9/2004 | Tabor |
| 6,819,563 B1 | 11/2004 | Chu et al. |
| 6,827,128 B2 | 12/2004 | Philpott et al. |
| 6,883,347 B2 | 4/2005 | Ayub |
| 6,894,899 B2 | 5/2005 | Wu et al. |
| 6,915,653 B2 | 7/2005 | Nakano et al. |
| 6,945,653 B2 | 9/2005 | Kobori et al. |
| 6,952,345 B2 | 10/2005 | Weber et al. |
| 6,973,801 B1 | 12/2005 | Campbell et al. |
| 6,986,382 B2 | 1/2006 | Upadhya et al. |
| 6,988,534 B2 | 1/2006 | Kenny et al. |
| 7,000,684 B2 | 2/2006 | Kenny et al. |
| 7,007,506 B2 | 3/2006 | Kubo et al. |
| 7,012,807 B2 | 3/2006 | Chu et al. |
| 7,021,367 B2 | 4/2006 | Oikawa |
| 7,029,647 B2 | 4/2006 | Tonkovich et al. |
| 7,032,651 B2 | 4/2006 | Winslow et al. |
| 7,044,198 B2 | 5/2006 | Matsushima et al. |
| 7,055,581 B1 | 6/2006 | Roy |
| 7,057,893 B2 | 6/2006 | Nicolai et al. |
| 7,086,247 B2 | 8/2006 | Campbell et al. |
| 7,104,312 B2 | 9/2006 | Goodson et al. |
| 7,123,996 B2 | 10/2006 | Fukushima et al. |
| 7,124,811 B2 | 10/2006 | Crocker et al. |
| 7,131,486 B2 | 11/2006 | Goodson et al. |
| 7,143,816 B1 | 12/2006 | Ghosh et al. |
| 7,149,084 B2 | 12/2006 | Matsushima et al. |
| 7,156,159 B2 | 1/2007 | Lovette et al. |
| 7,156,160 B2 | 1/2007 | Lee et al. |
| 7,190,580 B2 | 3/2007 | Bezama et al. |
| 7,201,217 B2 | 4/2007 | Johnson et al. |
| 7,206,203 B2 | 4/2007 | Campbell et al. |
| 7,209,355 B2 | 4/2007 | Koga et al. |
| 7,221,270 B2 | 5/2007 | Chen et al. |
| 7,248,006 B2 | 7/2007 | Bailey et al. |
| 7,259,965 B2 | 8/2007 | Chang et al. |
| 7,264,359 B2 | 9/2007 | Kawahara et al. |
| 7,274,566 B2 | 9/2007 | Campbell et al. |
| 7,278,273 B1 | 10/2007 | Whitted et al. |
| 7,301,771 B2 | 11/2007 | Hata et al. |
| 7,315,448 B1 | 1/2008 | Bash et al. |
| 7,318,322 B2 | 1/2008 | Ota et al. |
| 7,331,378 B2 | 2/2008 | Bhatti et al. |
| 7,360,582 B2 | 4/2008 | Olesen |
| 7,397,661 B2 | 7/2008 | Campbell et al. |
| 7,466,549 B2 | 12/2008 | Doerrich et al. |
| 7,466,553 B2 | 12/2008 | Hamman |
| 7,484,530 B2 | 2/2009 | Harvey et al. |
| 7,527,085 B2 | 5/2009 | Iijima et al. |
| 7,544,049 B2 | 6/2009 | Koga et al. |
| 7,562,444 B2 | 7/2009 | Vetter |
| 7,564,208 B2 | 7/2009 | Bailey et al. |
| 7,591,302 B1 | 9/2009 | Lenehan et al. |
| 7,599,184 B2 | 10/2009 | Upadhya et al. |
| 7,639,499 B1 | 12/2009 | Campbell et al. |
| 7,688,589 B2 | 3/2010 | Chiang |
| 7,757,506 B2 | 7/2010 | Ellsworth et al. |
| 7,762,314 B2 | 7/2010 | Campbell et al. |
| 7,791,882 B2 | 9/2010 | Chu et al. |
| 7,806,168 B2 | 10/2010 | Upadhya et al. |
| 7,905,106 B2 | 3/2011 | Attlesey |
| 7,925,746 B1 | 4/2011 | Melton |
| 7,957,144 B2 | 6/2011 | Goettert et al. |
| 7,961,465 B2 | 6/2011 | Goldrian et al. |
| 7,969,727 B2 | 6/2011 | Tozer et al. |
| 7,971,632 B2 | 7/2011 | Eriksen et al. |
| 7,978,472 B2 | 7/2011 | Campbell et al. |
| 8,051,898 B2 | 11/2011 | Chiang |
| 8,066,057 B2 | 11/2011 | Olesen et al. |
| 8,240,362 B2 | 8/2012 | Eriksen |
| 8,245,764 B2 | 8/2012 | Eriksen |
| 8,250,879 B2 | 8/2012 | Macbain et al. |
| 8,427,831 B2 | 4/2013 | Wei |

(56) References Cited

U.S. PATENT DOCUMENTS

| | | |
|---|---|---|
| 8,437,129 B2 | 5/2013 | Tung et al. |
| 8,441,789 B2 | 5/2013 | Wu et al. |
| 8,493,738 B2 | 7/2013 | Chainer et al. |
| 8,631,860 B2 | 1/2014 | Tang et al. |
| 8,687,364 B2 | 4/2014 | Chainer et al. |
| 8,724,315 B2 | 5/2014 | Branton |
| 8,746,330 B2 | 6/2014 | Lyon |
| 9,052,252 B2 | 6/2015 | Lyon et al. |
| 9,057,567 B2 | 6/2015 | Lyon |
| 9,453,691 B2 | 9/2016 | Lyon |
| 9,496,200 B2 | 11/2016 | Lyon et al. |
| 9,603,284 B2 | 3/2017 | Lyon |
| 9,715,260 B2 | 7/2017 | Eriksen |
| 9,733,681 B2 | 8/2017 | Eriksen |
| 9,909,820 B2 | 3/2018 | Lyon |
| 10,078,354 B2 | 9/2018 | Eriksen |
| 10,078,355 B2 | 9/2018 | Eriksen |
| 10,222,144 B2 | 3/2019 | Kusuda |
| 10,274,266 B2 | 4/2019 | Lyon |
| 10,599,196 B2 | 3/2020 | Eriksen |
| 10,613,601 B2 | 4/2020 | Eriksen |
| 10,820,450 B2 | 10/2020 | Lyon et al. |
| 10,842,043 B1 | 11/2020 | Zhang et al. |
| 11,175,102 B1 | 11/2021 | Harrington et al. |
| 11,287,861 B2 | 3/2022 | Eriksen |
| 11,725,886 B2 | 8/2023 | Mostafavi et al. |
| 2002/0070007 A1 | 6/2002 | Calaman et al. |
| 2002/0153885 A1 | 10/2002 | Blossfeld |
| 2002/0189790 A1 | 12/2002 | Wong |
| 2003/0010050 A1 | 1/2003 | Scott |
| 2003/0019234 A1 | 1/2003 | Wayburn et al. |
| 2003/0070792 A1 | 4/2003 | Tanaka et al. |
| 2003/0085028 A1 | 5/2003 | Galtz |
| 2003/0151130 A1 | 8/2003 | Cheon |
| 2003/0173839 A1 | 9/2003 | Torii et al. |
| 2003/0230400 A1 | 12/2003 | McCordic et al. |
| 2004/0008483 A1 | 1/2004 | Cheon |
| 2004/0040695 A1 | 3/2004 | Chesser et al. |
| 2004/0042171 A1 | 3/2004 | Takamatsu et al. |
| 2004/0042172 A1 | 3/2004 | Kusaka et al. |
| 2004/0052049 A1 | 3/2004 | Wu et al. |
| 2004/0052663 A1 | 3/2004 | Laing et al. |
| 2004/0057211 A1 | 3/2004 | Kondo et al. |
| 2004/0104010 A1 | 6/2004 | Kenny et al. |
| 2004/0104012 A1 | 6/2004 | Zhou et al. |
| 2004/0104022 A1 | 6/2004 | Kenny et al. |
| 2004/0112571 A1 | 6/2004 | Kenny et al. |
| 2004/0112585 A1 | 6/2004 | Goodson et al. |
| 2004/0123614 A1 | 7/2004 | Stewart |
| 2004/0182548 A1 | 9/2004 | Lovette et al. |
| 2004/0182560 A1 | 9/2004 | Kenny |
| 2004/0188066 A1 | 9/2004 | Upadhya |
| 2004/0188069 A1 | 9/2004 | Tomioka et al. |
| 2004/0206477 A1* | 10/2004 | Kenny .................. F04B 17/00 257/E23.098 |
| 2004/0240179 A1 | 12/2004 | Koga et al. |
| 2004/0250558 A1 | 12/2004 | Nakano et al. |
| 2005/0061482 A1 | 3/2005 | Lee et al. |
| 2005/0069432 A1 | 3/2005 | Tomioka |
| 2005/0098305 A1 | 5/2005 | Lee et al. |
| 2005/0126747 A1 | 6/2005 | Chu et al. |
| 2005/0128705 A1 | 6/2005 | Chu et al. |
| 2005/0178531 A1 | 8/2005 | Huang et al. |
| 2005/0180104 A1 | 8/2005 | Olesen et al. |
| 2005/0180107 A1 | 8/2005 | Naganawa et al. |
| 2005/0200001 A1 | 9/2005 | Joshi et al. |
| 2005/0205241 A1 | 9/2005 | Goodson et al. |
| 2005/0210906 A1 | 9/2005 | Laufer et al. |
| 2005/0211417 A1 | 9/2005 | Upadhya |
| 2005/0241809 A1 | 11/2005 | Tomioka et al. |
| 2005/0259397 A1 | 11/2005 | Bash et al. |
| 2005/0269061 A1 | 12/2005 | Brewer et al. |
| 2006/0002080 A1 | 1/2006 | Leija et al. |
| 2006/0002087 A1* | 1/2006 | Bezama ................ H01L 23/473 257/E23.098 |
| 2006/0002088 A1 | 1/2006 | Bezama |
| 2006/0011329 A1 | 1/2006 | Wang et al. |
| 2006/0094347 A1 | 5/2006 | Tracy et al. |
| 2006/0096738 A1 | 5/2006 | Kang et al. |
| 2006/0096740 A1 | 5/2006 | Zheng |
| 2006/0096743 A1 | 5/2006 | Lee |
| 2006/0137863 A1 | 6/2006 | Lee et al. |
| 2006/0143439 A1 | 6/2006 | Arumugam et al. |
| 2006/0162903 A1 | 7/2006 | Bhatti et al. |
| 2006/0171801 A1 | 8/2006 | Manabe et al. |
| 2006/0185829 A1 | 8/2006 | Duan et al. |
| 2006/0185830 A1 | 8/2006 | Duan |
| 2006/0187638 A1 | 8/2006 | Vinson et al. |
| 2006/0225867 A1 | 10/2006 | Park et al. |
| 2006/0231238 A1 | 10/2006 | Ball |
| 2006/0254755 A1 | 11/2006 | Chen et al. |
| 2007/0029069 A1 | 2/2007 | Duan |
| 2007/0034356 A1 | 2/2007 | Kenny et al. |
| 2007/0039719 A1 | 2/2007 | Eriksen et al. |
| 2007/0095512 A1 | 5/2007 | Chen et al. |
| 2007/0107886 A1 | 5/2007 | Chen |
| 2007/0125526 A1 | 6/2007 | Satou et al. |
| 2007/0131396 A1 | 6/2007 | Yu et al. |
| 2007/0163750 A1 | 7/2007 | Bhatti et al. |
| 2007/0193724 A1 | 8/2007 | Lin |
| 2007/0227704 A1 | 10/2007 | Nagai et al. |
| 2007/0227710 A1 | 10/2007 | Belady et al. |
| 2007/0256957 A1 | 11/2007 | Herrmann et al. |
| 2007/0272392 A1 | 11/2007 | Ghosh et al. |
| 2007/0297136 A1 | 12/2007 | Konshak |
| 2008/0041792 A1 | 2/2008 | Crnkovich et al. |
| 2008/0053641 A1 | 3/2008 | Lai et al. |
| 2008/0128114 A1 | 6/2008 | Lai et al. |
| 2008/0179045 A1 | 7/2008 | Hu et al. |
| 2008/0266726 A1 | 10/2008 | Murakami et al. |
| 2008/0288124 A1 | 11/2008 | Huang |
| 2008/0301941 A1 | 12/2008 | Anderson, Jr. et al. |
| 2008/0314367 A1 | 12/2008 | Goulette et al. |
| 2009/0021807 A1 | 1/2009 | Horita |
| 2009/0071625 A1 | 3/2009 | Lyon |
| 2009/0101315 A1 | 4/2009 | Cheng |
| 2009/0120622 A1 | 5/2009 | Koch |
| 2009/0139698 A1 | 6/2009 | Robinson |
| 2009/0145581 A1 | 6/2009 | Hoffman et al. |
| 2009/0154096 A1 | 6/2009 | Iyengar et al. |
| 2009/0228893 A1 | 9/2009 | Behrendt et al. |
| 2010/0012294 A1 | 1/2010 | Bezama et al. |
| 2010/0085708 A1 | 4/2010 | Martin et al. |
| 2010/0101765 A1 | 4/2010 | Campbell et al. |
| 2010/0103619 A1 | 4/2010 | Refai-Ahmed et al. |
| 2010/0103620 A1 | 4/2010 | Campbell et al. |
| 2010/0139887 A1 | 6/2010 | Slessman |
| 2010/0179695 A1 | 7/2010 | Collins et al. |
| 2010/0211669 A1 | 8/2010 | Dalgas et al. |
| 2010/0324962 A1 | 12/2010 | Nesler et al. |
| 2010/0326634 A1 | 12/2010 | Eriksen |
| 2011/0084839 A1 | 4/2011 | Groth et al. |
| 2011/0100045 A1 | 5/2011 | Carlson |
| 2011/0100618 A1 | 5/2011 | Carlson |
| 2011/0127027 A1 | 6/2011 | Kashirajima et al. |
| 2011/0154842 A1 | 6/2011 | Heydari et al. |
| 2011/0168379 A1 | 7/2011 | Morgan et al. |
| 2011/0174001 A1 | 7/2011 | Carlson et al. |
| 2011/0175498 A1 | 7/2011 | Bash et al. |
| 2011/0313576 A1 | 12/2011 | Nicewonger |
| 2012/0087088 A1 | 4/2012 | Killion et al. |
| 2012/0103009 A1 | 5/2012 | Ding et al. |
| 2012/0147553 A1 | 6/2012 | Eriksen |
| 2012/0152498 A1 | 6/2012 | Lyon |
| 2012/0170222 A1 | 7/2012 | Dede et al. |
| 2012/0175094 A1 | 7/2012 | Rice |
| 2012/0271567 A1 | 10/2012 | Da Point et al. |
| 2012/0273159 A1 | 11/2012 | Eriksen |
| 2013/0025818 A1 | 1/2013 | Lyon et al. |
| 2014/0158326 A1 | 6/2014 | Lyon |
| 2014/0186156 A1 | 7/2014 | Lai et al. |
| 2014/0251582 A1 | 9/2014 | Lyon |
| 2014/0266744 A1 | 9/2014 | Lyon et al. |
| 2015/0168474 A1 | 6/2015 | Yoshioka et al. |

(56) References Cited

U.S. PATENT DOCUMENTS

| | | |
|---|---|---|
| 2015/0355630 A1 | 12/2015 | Cedar et al. |
| 2016/0146219 A1 | 5/2016 | Lyon |
| 2016/0281704 A1 | 9/2016 | Lyon et al. |
| 2016/0377355 A1 | 12/2016 | Lyon |
| 2017/0023317 A1 | 1/2017 | Zhang et al. |
| 2017/0064874 A1 | 3/2017 | Lyon et al. |
| 2017/0196116 A1 | 7/2017 | Lyon |
| 2017/0329376 A1 | 11/2017 | Eriksen |
| 2018/0195810 A1 | 7/2018 | Lyon |
| 2019/0204026 A1 | 7/2019 | Lyon |
| 2020/0227341 A1 | 7/2020 | Neal et al. |
| 2020/0340767 A1 | 10/2020 | Holden et al. |
| 2020/0348202 A1 | 11/2020 | Farkas et al. |
| 2021/0127528 A1 | 4/2021 | Lyon et al. |
| 2022/0151099 A1 | 5/2022 | Gao |
| 2022/0151104 A1 | 5/2022 | Gao |
| 2022/0232732 A1 | 7/2022 | Alvarado et al. |
| 2022/0373275 A1 | 11/2022 | Mostafavi et al. |
| 2022/0377937 A1 | 11/2022 | Chen et al. |

FOREIGN PATENT DOCUMENTS

| | | | |
|---|---|---|---|
| DE | 20305281 U1 | 10/2003 | |
| EP | 0574823 A2 | 12/1993 | |
| EP | 0610826 A2 | 8/1994 | |
| EP | 1808892 | 7/2007 | |
| JP | 61032449 | 2/1986 | |
| JP | H03-17443 | 1/1991 | |
| JP | 06120387 | 4/1994 | |
| JP | 07-142886 A | 6/1995 | |
| JP | 08-032262 A | 2/1996 | |
| JP | 2000-208683 A | 7/2000 | |
| JP | 2002151638 | 5/2002 | |
| JP | 3452059 B1 | 9/2003 | |
| JP | 2005123496 A * | 5/2005 | |
| JP | 2007180505 | 7/2007 | |
| JP | 2007227902 | 9/2007 | |
| JP | 2007531991 | 11/2007 | |
| JP | 3179086 U | 10/2012 | |
| KR | 10-2003-0031027 A | 4/2003 | |
| KR | 20-2003-0006043 Y1 | 5/2003 | |
| KR | 20-0314041 Y1 | 5/2003 | |
| TW | M244511 U | 9/2004 | |
| TW | M244513 U | 9/2004 | |
| TW | M251183 U | 11/2004 | |
| TW | M251442 U | 11/2004 | |
| TW | M256682 U | 2/2005 | |
| TW | M273031 | 8/2005 | |
| TW | M298733 | 8/2005 | |
| TW | M275684 U | 9/2005 | |
| TW | M324810 U | 1/2008 | |
| TW | 200926951 A | 6/2009 | |
| WO | 0165900 | 9/2001 | |
| WO | 03/55055 A1 | 7/2003 | |
| WO | 03/98415 A1 | 11/2003 | |
| WO | WO-2004042306 A2 * | 5/2004 | F04B 17/00 |
| WO | 2005/017468 A2 | 2/2005 | |
| WO | 2005096377 | 10/2005 | |
| WO | WO2006052317 | 5/2006 | |
| WO | 2006119761 | 11/2006 | |

OTHER PUBLICATIONS

USPTO Patent Trial and Appeal Board Final Written Decision in Case IPR2015-01276 dated Dec. 8, 2016.
Osinski, United States Patent and Trademark Office Decision of Institution of Inter Partes Review. Filed Dec. 9, 2015 in Case IPR2015-01276.
Pollard, United States Patent and Trademark Office Patent Owner's Response. Filed Mar. 9, 2016 in Case IPR2015-01276.
Declaration of Dr. Donald Tilton (including his CV) from Petition for Inter Parties Review of U.S. Pat. No. 8,746,330 in *Asetek Danmark A/S* v, *CoolIT Systems Inc.* dated May 27, 2015.
Roy W. Knight et al., "Heat Sink Optimization with Application to Microchannels," IEEE Transactions on Components, Hybrids, and Manufacturing Technology, vol. 15, No. 5, Oct. 1992, pp. 832-842.
Kandlikar, So,High Flux Heat Removal with Microchannels—A Roadmap of Challenges and Opportunities, Heat Transfer Engrg. 26(8):5-14 (2005).
Steineke, M_and Kandlikar, So, Single-Phase Heat Transfer Enhancement Techniques in Microchannel and Minichannel Flows, Microchannels and Minichannels—Jun. 17-19, 2004, Rochester, New York, USA (2004).
Preissuance Submission Dated Jan. 9, 2015, in U.S. Appl. No. 13/401,618.
Examination Report dated Mar. 11, 2011, in European Patent Application No. 07075014.6; 3 pages total.
Technical Opinion dated Jan. 10, 2013, for Japanese Registration No. 3179086 (Utility Model Application No. 2012-002117); English translation included; 7 pages.
Chinese-language Search and Examination Reports dated Apr. 9, 2014, for Taiwan Patent Application No. 101110072 (English translation included); 40 pages total.
Office Action for U.S. Appl. No. 12/189,476 dated Apr. 13, 2012; 17 pages.
Final Office Action for U.S. Appl. No. 12/189,476 dated Jan. 7, 2013; 10 pages.
Notice of Allowance in U.S. Appl. No. 15/912,478, mailed Mar. 6, 2019, 11 pages.
Non-Final Office Action for U.S. Appl. No. 14/283,163, mailed Sep. 30, 2014, 10 pages.
Final Office Action for U.S. Appl. No. 14/283,163, mailed May 14, 2015, 13 pages.
Non-Final Office Action for U.S. Appl. No. 14/283,163, mailed Sep. 4, 2015, 13 pages.
Final Office Action for U.S. Appl. No. 14/283,163, mailed Jun. 15, 2016, 12 pages.
Notice of Allowance in U.S. Appl. No. 14/283,163, mailed Jan. 19, 2017, 17 pages.
Non-Final Office Action in U.S. Appl. No. 14/777,510, mailed Apr. 23, 2018, 23 pages.
Non-Final Office Action in U.S. Appl. No. 15/354,981, mailed May 8, 2018, 19 pages.
Non-Final Office Action in U.S. Appl. No. 15/351,362, mailed Nov. 18, 2019, 12 pages.
Claim Construction Order, Docket 149, *Asetek Denmark A/S* v. *CoolIT Systems, Inc.*, 3:19-cv-00410-EMC (N.D. Cal., Jul. 22, 2020).
Final Written Decision, Paper 50, *Asetek Denmark A/S* v. *CoolIT Systems, Inc.*, IPR2020-00825 (P.T.A.B., Oct. 12, 2021) (on appeal to CAFC, stipulated motion to withdraw appeal pending).
Declaration of Marc Hodes, Ph.D., Exhibit 2001, *Asetek Denmark A/S* v. *CoolIT Systems, Inc.*, IPR2020-00825 (P.T.A.B., Oct. 12, 2021) (on appeal to CAFC, stipulated motion to withdraw appeal pending).
Corrected Declaration of Himanshu Pokharna, Ph.D., Exhibit 2038, *Asetek Denmark A/S* v. *CoolIT Systems, Inc.*, IPR2020-00825 (P.T.A.B., Oct. 12, 2021) (on appeal to CAFC, stipulated motion to withdraw appeal pending).
CPU-360 Water Block (AMD/Intel Processor). Rev 1.1, Koolance, (https://koolance.com/cpu-360-processor-water-block) last accessed on Oct. 30, 2020, 1 page.
"Asetek WaterChill Antarctica Water Cooling Kit," Asetek, (https://www.extremeoverclocking.com/reviews/cooling/WaterChill_Antarctica_1.html) last accessed on Oct. 30, 2020, 11 pages.
Hilbert Hagedoom, "Aseteck Waterchill Watercooling—p. 1—a Chill Introduction," Guru3D.com, Feb. 28, 2005, 25 pages.
Hilbert Hagedoom, "Koolance CPU-360 Waterblock," Guru.com, Feb. 9, 2010, (https://www.guru3d.com/news-story/koolance-cpu-360-waterblock), last accessed on Nov. 3, 2020, 2 pages.
Matthew Homan, "WaterChill By Asetek," TechwareLabs, LLC, Dec. 11, 2004, (http://www.techwarelabs.com/reviews/cooling/asetek_waterchill/) last accessed on Oct. 30, 2020 3 pages.
3DGAMEMAN, "#530—Asetek WaterChill2 Water Cooling Kit," YouTube, Jul. 16, 2006, (https://www.youtube.com/watch?v=60XNAXO9cxY) last accessed on Oct. 30, 2020.

(56) References Cited

OTHER PUBLICATIONS

3DGAMEMAN, "#596—Asetek Xtreme WaterChill Water Cooling Kit," YouTube, Jul. 17, 2006, (https://www.youtube.com/watch?v=Z9XSJBCJttU) last accessed on Oct. 29, 2020.
Adrian Willson, "(1080) Koolance CPU 360 CPU Waterblock Review," YouTube, Mar. 14, 2010, (https://www.youtube.com/watch?v=hhWP7rF1uQs) last accessed on Oct. 30, 2020.
Super1080p, "(1080) Koolance CPU 360 CPU Waterblock Review," YouTube, Mar. 17, 2010, (https://www.youtube.com/watch?v=3kg4Yvl1XLU) last accessed on Oct. 30, 2020.
"WaterChill CPU Cooler Antarctica For Intel Socket 478, AMD Socket A/754/940," Apr. 13, 2004, 14 pages, Version 4.0, Asetek, Inc.
"WaterChill CPU Cooler Antarctica For Intel Socket 478, AMD Socket 462/754/940," Jun. 4, 2004, 9 pages, Version 4.1, Asetek, Inc.
"WaterChill CPU Cooler Antarctica For Intel Socket 478, AMD Socket A/754/940," Mar. 30, 2004, 2 pages, Version 4.0, Asetek, Inc.
"WaterChill CPU Cooler Antarctica Pour Port Intel Socket 478, AMD Socket 462/754/940," Jun. 4, 2004, 10 pages, Version 4.0, Asetek, Inc.
"WaterChill CPU-Kühler Antarctica Für Intel Socket 478, AMD Socket 462/754/940," Jun. 4, 2004, 10 pages, Version 4.0, Asetek, Inc.
Refrigerador de CPUs WaterChill Antarctica Para Intel Socket 478, AMD Socket 462/754/940, Jun. 4, 2004, 9, pages, Version 4.0, Asetek, Inc.
"WaterChill CPU-Kühler Antarctica Für Intel Socket 478, AMD Socket 462/754/939/940," Jun. 4, 2004, & Oct. 18, 2004, 9 pages, Version 4.0 & 4.1, Asetek, Inc.
"WaterChill CPU Cooler Antarctica For Intel Socket 478, AMD Socket 462/754/939/940," Jun. 4, 2004 & Oct. 18, 2004, 9 pages, Version 4.0 & 4.1, Asetek, Inc.
"Refrigerador de CPUs WaterChill Antarctica Para Intel Socket 478, AMD Socket 462/754/939/940," Jun. 4, 2004 and Oct. 18, 2004, 9, pages, Version 4.0 & 4.1, Asetek, Inc.
"WaterChill CPU Cooler Antarctica Pour Port Intel Socket 478, AMD Socket 462/754/939/940," Jun. 4, 2004 & Oct. 18, 2004, 10 pages, Version 4.0 & 4.1, Asetek, Inc.
Dave Altavilla, "Asetek Antarctica WaterChill Water Cooling Kit.," HotHardware.com, Jun. 8, 2004, (https://hothardware.com/reviews/asetek-antarctica-waterchill-water-cooling-kit) last accessed on Nov. 3, 2020, 7 pages.
Final Office Action for U.S. Application No. 14/283, 163, mailed May 14, 2015, 13 pages.
Non-Final Office Action in U.S. Appl. No. 15/462,753, mailed May 11, 2017, 11 pages.
Final Office Action in U.S. Appl. No. 15/462,753, mailed Sep. 15, 2017, 14 pages.
USPTO Examiner's Answer in U.S. Appl. No. 15/462,753, mailed Jan. 24, 2019, 16 pages.
USPTO Patent and Trial Appeal Board Decision on Appeal in U.S. Appl. No. 15/462,753, mailed Aug. 25, 2020, 20 pages.
Rob Darby, "Internal Flow Applications," Chemical Engineering Fluid Mechanics, 2001, pp. 195-238, Chapter 7, Marcel Dekker, Inc., New York, NY.
John S. Scott, "Header" and "Manifold," Dictionary of Civil Engineering, 4th Edition, 1993, pp. 211 and 269, Van Nostrand Reinhold, New York, NY.
Petition for Inter Partes Review in *Asetek Danmark A/S* v. *CoolIT Systems, Inc.*, Mar. 26, 2020, Case IPR2020-00747.
Patent Owner's Preliminary Response in *Asetek Danmark A/S* v. *CoolIT Systems, Inc.*, Jul. 7, 2020, Case IPR2020-00747.
Petitioner's Reply to Patent Owner's Preliminary Response in *Asetek Danmark A/S* v. *CoolIT Systems, Inc.*, Jul. 24, 2020, Case IPR2020-00747.
Patent Owner's Sur-Reply in Support of Patent Owner's Preliminary Response in *Asetek Danmark A/S* v. *CoolIT Systems, Inc.*, Aug. 7, 2020, Case IPR2020-00747.
Institution Decision entered Oct. 2, 2020, Case IPR2020-00747.
Declaration of Donald E. Tilton, PH.D. in *Asetek Danmark A/S* v. *CoolIT Systems, Inc.*, Mar. 25, 2020, Case IPR2020-00747.
Petition for Inter Partes Review in *Asetek Danmark A/S* v. *CoolIT Systems, Inc.*, Apr. 10, 2020, Case IPR2020-00825.
Patent Owner's Preliminary Response in *Asetek Danmark A/S* v. *CoolIT Systems, Inc.*, Jul. 14, 2020, Case IPR2020-00825.
Petitioner's Reply to Patent Owner's Preliminary Response in *Asetek Danmark A/S* v. *CoolIT Systems, Inc.*, Jul. 31, 2020, Case IPR2020-00825.
Patent Owner's Sur-Reply in Support of Patent Owner's Preliminary Response in *Asetek Danmark A/S* v. *CoolIT Systems, Inc.*, Jul. 31, 2020, Case IPR2020-00825.
Institution Decision entered Oct. 13, 2020, IPR2020-00825.
Declaration of Donald E. Tilton, PH.D. in *Asetek Danmark A/S* v. *CoolIT Systems, Inc.*, Apr. 10, 2020, Case IPR2020-00825.
"Asetek WaterChill" Techspot, Mar. 14, 2006 (https://www.techspot.com/community/topics/asetek-waterchill.46119/), last accessed Sep. 30, 2021, 7 pages.
"Asetek Antarctica Waterblock" Overlookers, Feb. 28, 2004 (https://www.overclockers.com/asetek-antarctica-waterblock/) last accessed, Sep. 30, 2021, 6 pages.
"Asetek Antarctica WaterChill CPU Cooling Kit Review," Overclocker Club, Apr. 25, 2004 (https://www.overclockersclub.com/reviews/asetek/5.htm) last accessed Sep. 30, 2021.
Altavilla, Dave, "Asetek Antarctica WaterChill Water Cooling Kit" Hot Hardware, Inc., Jun. 8, 2004, 4 pages (https://hothardware.com/reviews/asetek-antarctica-waterchill-water-cooling-kit) last accessed Sep. 30, 2021.
Ryszard Sommefeldt, "Review: Asetek WaterChill Antarctica KT03A-L30," HEXUS.net, Aug. 2, 2004, 3 pages (https://m.hexus.net/tech/reviews/cooling/791-asetek-waterchill-antarctica-kt03a-130/?page=2) last accessed Sep. 30, 2021.
"Asetek Reviews" TechPowerUp Review Database (https://www.techpowerup.com/reviewdb/Cooling/Water/Asetek/) last accessed Sep. 30, 2021, 3 pages.
U.S. Appl. No. 13/269,234, Notice of Allowability dated May 23, 2012, p. 2-3.
USPTO Patent Trial and Appeal Board Decision of Institution of Inter Parties Review, filed Dec. 9, 2015 in Case IPR2015-01276.
Vegas, et al., "Stiffness, Compliance, Resilience, and Creep Deformation: Understanding Implant-Soft Tissue Dynamics in the Augmented Breast: Fundamentals Based on Materials Science", Aesth Plast Surg 37:922-930 (2013).
Vertal, L. "Water Cooling Comes of Age Again," Asetek Data Center Liquid Cooling, Published on Oct. 11, 2013, Retrieved from the Internet URL: http://www.asetek.com/press-room/blog/2013/water-cooling-come-of-age-again/, on Jan. 4, 2018, pp. 1-10.
Viton™ Fluoroelastomers: High-Performance, available from www.viton.com/en/products (last visited Jan. 5, 2023).
Zhang, et al. "Single Phase Liquid Cooled Microchannel Heat Sink for Electronic Packages," Applied Thermal Engineering 25, May 25, 2004.
Adjacent Merriam-Webster's Collegiate Dictionary, 10th ed. 2001, p. 14, Springfield, MA.
Asetek 645LT 92 mm AIO: The small and famous cooler is back!, Glob3trotters, http://glob3trotters.com/portfolio/asetek-645It-92-mm-aio-the-small-and-famous-cooler-is-back/ (last visited Jan. 5, 2023).
Ashby, et al., Engineering Materials 1: An Introduction to Properties, Applications, and Design, Ch. 3:29-53, Ch. 8:115-133 (4th ed. 2012.
Brazing Handbook (4th ed. 1991), American Welding Society, copyright 2002.
Callister, Jr., et al. "Mechanical Propertiesof Metals," Materials Science and Engineering—An Introduction, Eighth Ed. 2010, pp. 150-196.
Centrifugal Pump Overview, Appendix B., http://nptel.ac.in/courses/112104117/ui/Course_home-8.htm, Jan. 5, 2018, pp. 1-10.
Chad Sebring, Asus ROG Strix LC 120 RGB CPU Cooler Review, TweekTown (Aug. 20, 2020, 9:40 am CDT), https://wwwtweaktown.com/reviews/9556/asus-rog-strix-lc-120-rgb-cpu-cooler-index.html (last visited Jan. 5, 2023).

(56) References Cited

OTHER PUBLICATIONS

Chinese-language Preliminary Examination Report for Taiwan Patent Application No. 101110072; 20 pages.
Claim Construction Order (Dkt. 149), 26-29, *Asetek Danmark A/S v. CoolIT Systems, Inc.*, 3:19-cv-00410-EMC, (N.D. Cal. Jul. 22, 2020), 45 pgs.
Claim Construction Order, Docket 258, *Asetek Danmark A/S v. CoolIT Systems, Inc.*, 3:19-cv-00410-EMC (N.D. Cal., Jul. 8, 2021).
Concise Oxford English Dictionary (12th ed. 2011), 741 (definition of "interlock").
Declaration of Arpita Bhattacharyya in *Asetek Danmark A/S v. CoolIT Systems, Inc.*, May 26, 2020, Case IPR2020-0524.
Declaration of Donald E. Tilton, Ph. D. in *Asetek Danmark A/S v. CoolIT Systems, Inc.*, Nov. 30, 2020, Case IPR2020-0522.
Declaration of Donald E. Tilton, Ph. D. in *Asetek Danmark A/S v. CoolIT Systems, Inc.*, Nov. 30, 2020, Case IPR2020-0523.
Declaration of Donald E. Tilton, Ph. D. in *Asetek Danmark A/S v. CoolIT Systems, Inc.*, Nov. 30, 2020, Case IPR2020-0524.
Declaration of Donald E. Tilton, Ph.D. in *Asetek Danmark NS v. CoolIT Systems, Inc.*, Apr. 10, 2020, Case IPR2020-00825.
Declaration of John Hamill in *Asetek Danmark A/S v. CoolIT Systems, Inc.*, Nov. 25, 2020, Case IPR2020-0523.
Declaration of Joseph Rosselli, Q.C. in *Asetek Danmark A/S v. CoolIT Systems, Inc.*, May 23, 2020, Case IPR2020-0523.
Declaration of Joseph Rosselli, Q.C. in *Asetek Danmark A/S v. CoolIT Systems, Inc.*, May 23, 2020, Case IPR2020-0524.
Declaration of Robert F. McCauley in *Asetek Danmark A/S v. CoolIT Systems, Inc.*, May 26, 2020, Case IPR2020-0523.
Declaration of Robert F. McCauley in *Asetek Danmark A/S v. CoolIT Systems, Inc.*, Oct. 14, 2020, Case IPR2020-0522.
Declaration of Robert F. McCauley in *Asetek Danmark A/S v. CoolIT Systems, Inc.*, Oct. 14, 2020, Case IPR2020-0524.
Ellsworth, M.J. Jr. et al., "The Evolution of Water Cooling for IBM Large Server Systems: Back to the Future," IEEE, CoolIT Systems Inc. Exhibit 1017, pp. 1-9, (2008).
Ellsworth, M.J. Jr. P.E., "Thermal Design and Implementation of Robust Liquid Cooling Systems for High Performance Computer Systems," Systems and Technology Group, IBM, InterPACK '11, dated Jul. 6-8, 2011, pp. 1-64.
Examiner's Answer in U.S. Appl. No. 15/462,753, mailed Jan. 24, 2019, 16 pages.
Filing Receipt mailed Aug. 21, 2007 for U.S. Appl. No. 60/954,987, filed Aug. 9, 2007.
Final Office Action dated Jan. 7, 2013, for U.S. Appl. No. 12/169,476, of Lyon, G.S., filed Aug. 11, 2008.
Final Office Action for U.S. Appl. No. 15/462,753 mailed Nov. 20, 2023.
Final Office Action in U.S. Appl. No. 13/401,618, mailed Jan. 26, 2016, 23 pages.
Final Office Action in U.S. Appl. No. 13/559,340, mailed Sep. 8, 2015, 13 pages.
Final Written Decision, Paper 50, *Asetek Danmark A/S v. CoolIT Systems, Inc.*, IPR2020-00825 (P.T.A.B., Oct. 12, 2021) (on appeal to CAFC, stipulated motion to withdraw appeal pending).
Gabriel Torres, CoolIT Water-Cooling Products, http://hardwaresecrets.com/printpage/CoolIT-Water-Cooling-Product/515, Jan. 14, 2008, 9 pages.
Gabriel Torres, CoolIT Water-Cooling Products, http://hardwaresecrets.com/printpage/CoolIT-Water-Cooling-Product/515, Jan. 14, 2008, 9 pages.
Garrett Carver, NZXT Kraken Z73 Review: Pretty, Pricey Performance, Tom's Hardware (Jan. 28, 2020), https://www.tomshardware.com/reviews/nzxt-kraken-z73 (last visited Jan. 5, 2023).
https://www.researchgate.net/publication/3521254, titled "Microchannel heat exchanger optimization", George Harpole, Mar. 1991.
Institution Decision entered Aug. 24, 2020, Case IPR2020-00522.
Institution Decision entered Aug. 24, 2020, Case IPR2020-00523.
Institution Decision entered Aug. 24, 2020, Case IPR2020-00524.

International Preliminary Report on Patentability received for PCT Patent Application No. PCT/IB2022/054242, mailed on Nov. 30, 2023, 5 pages.
International Search Report and Written Opinion received for PCT Patent Application No. PCT/IB2022/054242, mailed on Aug. 27, 2022, 9 pages.
Knight, R.W., et al., "Heat Sink Optimization with Application to Microchannels," IEEE Transactions on Components, Hybrids, and Manufacturing Technology, vol. 15, No. 5, Oct. 1992, pp. 832-842.
Merriam Webster's Collegiate Dictionary (11th ed. 2011), 413, 765 (definitions of "mate" and "engage").
Merriam-webster definition of beveled, dated Jan. 26, 2016, retrieved from internet URL: http://www.merriam-webster.com/dictionary/beveled, pp. 1-4.
Non-Final Office Action dated Apr. 13, 2012, for U.S. Appl. No. 12/169,476, of Lyon, G.S., filed Aug. 11, 2008.
Non-Final Office Action for U.S. Appl. No. 15/912,478, mailed Oct. 15, 2018, 6 pages.
Non-Final Office Action for U.S. Appl. No. 15/462,753 mailed May 3, 2023.
Non-Final Office Action in U.S. Appl. No. 13/401,618, mailed Jul. 28, 2015, 20 pages.
Non-Final Office Action in U.S. Appl. No. 13/559,340, mailed Jan. 15, 2016, 22 pages.
Non-Final Office Action in U.S. Appl. No. 13/559,340, mailed Mar. 26, 2015, 12 pages.
Non-Final Office Action in U.S. Appl. No. 15/263,210, mailed Feb. 10, 2017, 5 pages.
Non-Final Office Action in U.S. Appl. No. 16/297,289, mailed May 6, 2020, 6 pages.
Notice of Allowance for U.S. Appl. No. 17/326,158 mailed Dec. 9, 2022.
NZXT Kraken Z73 Review, https://www.ocinside.de/review/nzxt_kraken_z73/# (last visited Jan. 5, 2023).
Office Action for Taiwan Application No. 111118805, mailed Jan. 7, 2023, 4 pages.
Office Action for U.S. Appl. No. 15/462,753 mailed Feb. 2, 2021.
Office Action received for Chinese Patent Application No. 202280043891.1, mailed on Jun. 25, 2024, 14 pages (5 pages of English Translation and 9 pages of Original Document).
Office Action received for Chinese Patent Application No. 202280043891.1, mailed on Nov. 16, 2024, 16 pages (7 pages of English Translation and 9 pages of Original Document).
Patel, et al., "Computational Fluid Dynamics Modeling of High Compute Density Data Centers to Assure System Inlet Air Specifications", Proceedings of IPACK'01, Jul. 8-13, 2001; 9 pgs.
Patent Owner's Preliminary Response in *Asetek Danmark A/S v. CoolIT Systems, Inc.*, May 26, 2020, Case IPR2020-0523.
Patent Owner's Preliminary Response in *Asetek Danmark A/S v. CoolIT Systems, Inc.*, May 26, 2020, Case IPR2020-0524.
Patent Owner's Response in *Asetek Danmark A/S v. CoolIT Systems, Inc.*, Nov. 30, 2020, Case IPR2020-00522.
Patent Owner's Response in *Asetek Danmark A/S v. CoolIT Systems, Inc.*, Nov. 30, 2020, Case IPR2020-0523.
Patent Owner's Response in *Asetek Danmark A/S v. CoolIT Systems, Inc.*, Nov. 30, 2020, Case IPR2020-0524.
Petition for Inter Partes Review in *Asetek Danmark A/S v. CoolIT Systems, Inc.*, Feb. 7, 2020, Case IPR2020-00522.
Petition for Inter Partes Review in *Asetek Danmark A/S v. CoolIT Systems, Inc.*, Feb. 7, 2020, Case IPR2020-00523.
Petition for Inter Partes Review in *Asetek Danmark A/S v. CoolIT Systems, Inc.*, Feb. 7, 2020, Case IPR2020-00524.
Petition for Inter Partes Review of U.S. Pat. No. 8,749,968; United States Patent and Trademark Office, Before the Patent Trial and Appeal Board, *CoolIT Systems, Inc. v. Asetek A/S*, Inter Parties Review No. 2014-01172, Jul. 16, 2014, 61 pages.
Petition for Inter Parties Review of U.S. Pat. No. 8,746,330 in *Asetek Danmark A/S v. CoolIT Systems, Inc.* filed May 27, 2015.
Petitioner's Reply to Patent Owner's Preliminary Response in *Asetek Danmark A/S v. CoolIT Systems, Inc.*, Jun. 5, 2020, Case IPR2020-00522.

(56) References Cited

OTHER PUBLICATIONS

Petitioner's Reply to Patent Owner's Preliminary Response in *Asetek Danmark A/S v. CoolIT Systems, Inc.*, Jun. 5, 2020, Case IPR 2020-0524.

Petitioner's Reply to Patent Owner's Preliminary Response in *Asetek Danmark A/S v. CoolIT Systems, Inc.*, Jun. 5, 2020, Case IPR2020-0523.

Petrie, "Handbook of Adhesives and Sealants" Ch 1 (Intoduction to Adhesive and Sealant), Ch 2 (Therories of Adhesion).

Pollard, United States Patent and Trademark Office Patent Owner's Response. Filed Mar. 9, 2016 in Case PR2015-01276.

Preliminary Amendment dated Jan. 9, 2009, p. 4., U.S. Appl. No. 11/919,974.

Preliminary Amendment dated Jul. 14, 2011, "Marked-Up Substitute Specification," U.S. Appl. No. 11/919,974.

Preliminary Amendment dated Mar. 10, 2011, p. 7, U.S. Appl. No. 11/919,974.

Preliminary Amendment dated Nov. 6, 2007, p. 3, U.S. Appl. No. 11/919,974.

Reexam Control No. 95/002,386, Decision on Appeal, Apr. 29, 2016, reh'g denied, Sep. 19, 2016.

Reexam Control No. 95/002,386, Right of Appeal Notice, Jun. 30, 2014, p. 3-4.

Rich Edmonds, NZXT Kraken Z63 and Z73 review: Amazing AIO coolers with a fancy LCD display, Windows Central (Jan. 28, 2020), https://www.windowscentral.com/nzxt-kraken-z63-z73-review (last visited Jan. 5, 2023).

Schmidt, R.R., "Liquid Cooling is Back," Electronics Cooling Magazine, Published Aug. 1, 2005, Retrieved from the Internet URL: https://www.electronics-cooling.com/2005/08/liquid-cooling-is-back/, on Apr. 30, 2014, pp. 1-7.

Search Report and Examination with English Translation for Taiwanese Application No. 101110072, dated Apr. 9, 2014, 40 pages.

Shigley, et al. (eds.), "Standard Handbook of Machine Design," McGraw-Hill 2 ed. 1996.

Smith, Mechanical Engineer's Reference Book, 12th ed., 1994, Section 16.4 (Adhesives), 19 pages.

Steve Burke, NZXT Kraken X52, X62, & X42 Review & Benchmarks vs. H100iV2, Predator 280, Gamers Nexus (Oct. 29, 2016, 12:14 pm), https://www.gamersnexus.net/hwreviews/2662-nzxt-kraken-x52-x62-x42-review-and-benchmarks-noise-temp) last visited Jan. 5, 2023).

U.S. Appl. No. 13/269,234, Amendment, Apr. 6, 2012, p. 8-10.

\* cited by examiner

FLUID HEAT EXCHANGER CONFIGURED TO PROVIDE A SPLIT FLOW

CROSS REFERENCE TO RELATED APPLICATIONS

This application is a continuation of, and claims the benefit of and priority to co-pending U.S. patent application Ser. No. 15/462,753, filed Mar. 17, 2017, which is a continuation of U.S. patent application Ser. No. 14/283,163, filed on May 20, 2014, now U.S. Pat. No. 9,603,284, which claims the benefit of and priority to U.S. patent application Ser. No. 12/189,476, filed on Aug. 11, 2008, now U.S. Pat. No. 8,746,330, which claims benefit of and priority to U.S. Provisional Patent Application No. 60/954,987, filed on Aug. 9, 2007, each of which patent applications is hereby incorporated by reference in its respective entirety, for all purposes.

FIELD

The present invention is directed to a fluid heat exchanger and, in particular, a fluid heat exchanger for an electronics application such as in a computer system.

BACKGROUND

Fluid heat exchangers are used to cool electronic devices by accepting and dissipating thermal energy therefrom.

Fluid heat exchangers seek to dissipate to a fluid passing therethrough, thermal energy communicated to them from a heat source.

SUMMARY

In accordance with a broad aspect of the invention, there is provided a fluid heat exchanger comprising: a heat spreader plate including an intended heat generating component contact region; a plurality of microchannels for directing heat transfer fluid over the heat spreader plate, the plurality of microchannels each having a first end and an opposite end and each of the plurality of microchannels extending substantially parallel with each other microchannel and each of the plurality of microchannels having a continuous channel flow path between their first end and their opposite end; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends, the fluid inlet opening and the first and opposite fluid outlet openings providing that any flow of heat transfer fluid that passes into the plurality of microchannels, flows along the full length of each of the plurality of microchannels in two directions outwardly from the fluid inlet opening.

In accordance with another broad aspect of the present invention, there is provided a method for cooling a heat generating component comprising: providing a fluid heat exchanger including a heat spreader plate; a plurality of microchannels for directing heat transfer fluid over the heat spreader plate, the plurality of microchannels each having a first end and an opposite end and each of the plurality of microchannels having a continuous channel flow path between their first ends and their opposite ends; a fluid inlet opening for the plurality of microchannels and positioned between the microchannel first and opposite ends, a first fluid outlet opening from the plurality of microchannels at each of the microchannel first ends; and an opposite fluid outlet opening from the plurality of microchannels at each of the microchannel opposite ends; mounting the heat spreader plate onto the heat generating component creating a heat generating component contact region where the heat generating component contacts the heat spreader plate; introducing a flow of heat exchanging fluid to the fluid heat exchanger; urging the flow of heat exchanging fluid through the fluid inlet into the plurality of microchannels first to a microchannel region between the ends of the microchannel; and, diverting the flow of heat exchanging fluid into a plurality of subflows that each flow away from the other, a first of the plurality of subflows flowing from the fluid inlet toward the first fluid outlet and a second of the plurality of subflows flowing from the fluid inlet toward the opposite fluid outlet.

It is to be understood that other aspects of the present invention will become readily apparent to those skilled in the art from the following detailed description, wherein various embodiments of the invention are shown and described by way of illustration. As will be realized, the invention is capable for other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Referring to the drawings wherein like reference numerals indicate similar parts throughout the several views, several aspects of the present invention are illustrated by way of example, and not by way of limitation, in detail in the figures, wherein.

DESCRIPTION OF VARIOUS EMBODIMENTS

The detailed description set forth below in connection with the appended drawings is intended as a description of various embodiments of the present invention and is not intended to represent the only embodiments contemplated by the inventor. The detailed description includes specific details for the purpose of providing a comprehensive understanding of the present invention. However, it will be apparent to those skilled in the art that the present invention may be practiced without these specific details.

Figure 1:
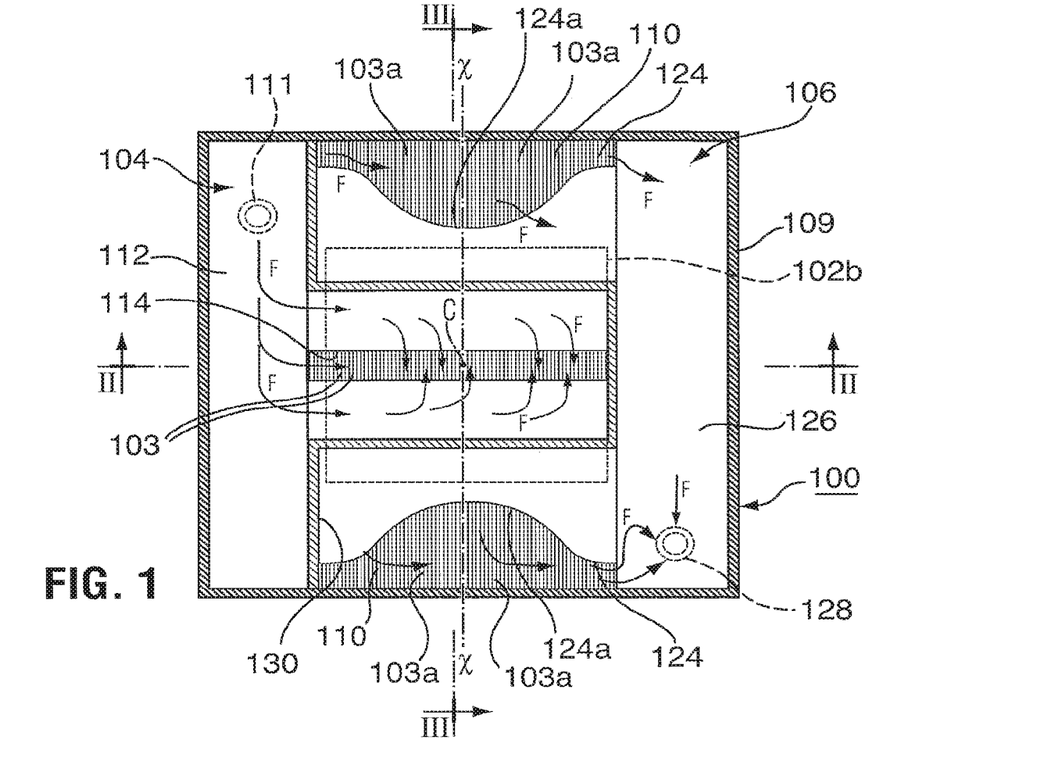
FIG. 1 is a top plan view of a fluid heat exchanger according to one embodiment of the invention, with the top cap cut away to facilitate viewing internal components.
Figure 2:
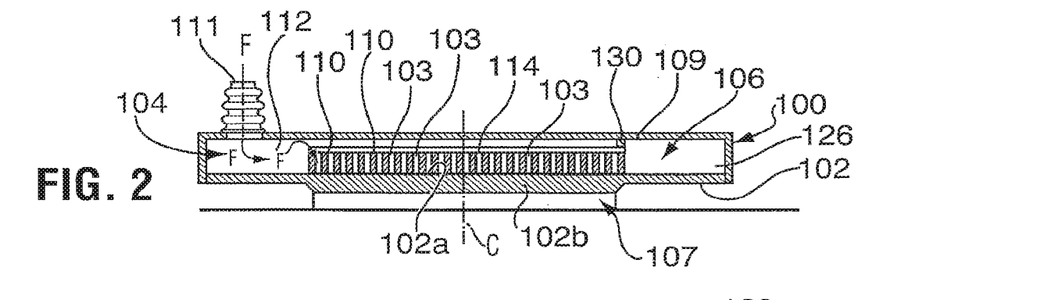
FIG. 2 is a sectional view along line II-II of FIG. 1.
Figure 3:
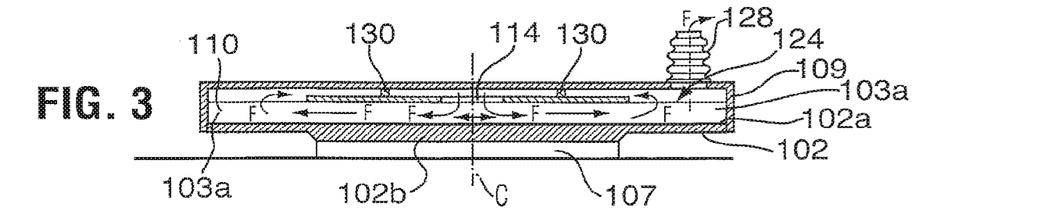
FIG. 3 is a sectional view along line III-III of FIG. 1.

With reference to FIGS. 1 to 3, a fluid heat exchanger 100 is shown. Fluid heat exchanger 100 includes a heat spreader plate 102, an arrangement of fluid microchannels 103 defined between walls 110, a fluid inlet passage 104, and a fluid outlet passage 106. A housing 109 operates with heat spreader plate 102 to form an outer limit of the heat sink and to define fluid flow passages 104, 106.

As shown in FIGS. 2 and 3, in use the heat exchanger 100 is coupled to a heat source 107, such as an electronic device, including, but not limited to a microchip or an integrated circuit. The heat exchanger may be thermally coupled to the heat source by a thermal interface material disposed therebetween, by coupling directly to the surface of the heat source, or by integrally forming the heat source and at least the heat spreader plate 102 of the fluid heat exchanger. The heat exchanger 100 may take various forms and shapes, but heat spreader plate 102 is formed to accept thermal energy from heat source 107. Heat spreader plate 102 includes an intended heat generating component contact region 102b positioned in a known location thereon. In the illustrated embodiment, heat spreader plate 102 includes a protrusion at region 102b that controls the positioning of the heat spreader plate relative to the heat source, but such a protrusion need not be included. Heat spreader plate 102 may include a portion of more conductive material to facilitate and control heat transfer, if desired. In any event, heat spreader plate is formed to fit over and thermally communicate with a heat source in a region 102b, usually located centrally relative to the edges of the heat spreader plate.

Microchannels 103 are formed to accept and allow passage therethrough of the flow of heat exchanging fluid such that the fluid can move along heat spreader plate 102 and walls 110 and accept and dissipate heat energy from them. In the illustrated embodiment, microchannels 103 are defined by walls 110 that are thermally coupled to the heat spreader plate to accept thermal energy therefrom. For example, heat spreader plate 102 may include an inner facing, upper surface 102a and a plurality of microchannel walls 110 may extend upwardly therefrom, whereby the channel area, defined between upper surface 102a and the microchannel walls 110, channels or directs fluid to create a fluid flow path. The channel area may be open or filled with thermally conductive porous material such as metal or silicon foam, sintered metal, etc. Thermally conductive, porous materials allow flow through the channels but create a tortuous flow path.

Surface 102a and microchannel walls 110 allow the fluid to undergo exchange of thermal energy from the heat spreader plate to cool the heat source coupled to the heat spreader plate. The upper surface 102a and walls 110 have a high thermal conductivity to allow heat transfer from the heat source 107 to fluid passing through channels 103. The surfaces forming channels 103 may be smooth and solid, formed with a porous structure, such as of sintered metal and/or metal or silicon foam or roughened, for example, including troughs and/or crests designed to collect or repel fluid from a particular location or to create selected fluid flow properties. Facing microchannel walls 110 may be configured in a parallel configuration, as shown, or may be formed otherwise, provided fluid can flow between the microchannel walls 110 along a fluid path. It will be apparent to one skilled in the art that the microchannel walls 110 may be alternatively configured in any other appropriate configuration depending on various factors of desired flow, thermal exchange, etc. For instance, grooves may be formed between sections of microchannel walls 110. Generally, microchannel walls 110 may desirably have dimensions and properties which seek to reduce or possibly minimize the pressure drop or differential of fluid flowing through the channels 103 defined therebetween.

The microchannel walls 110 may have a width dimension within the range of 20 microns to 1 millimeter and a height dimension within the range of 100 microns to five millimeters, depending on the power of the heat source 107, desired cooling effect, etc. The microchannel walls 110 may have a length dimension which ranges between 100 microns and several centimeters, depending on the dimensions of, and the heat flux density from, the heat source. In one embodiment, the walls 110 extend the full length (which may be a width) dimension of the heat spreader plate passing fully through region 102b. These are exemplary dimensions and, of course, other microchannel wall dimensions are possible. The microchannel walls 110 may be spaced apart by a separation dimension range of 20 microns to 1 millimeter, depending on the power of the heat source 107, although other separation dimensions are contemplated.

Other microporous channel configurations may be used alternatively to, or together with, microchannels, such as for example, a series of pillars, fins, or undulations, etc. which extend upwards from the heat spreader plate upper surface or tortuous channels as formed by a foam or sintered surface.

Fluid heat exchanger 100 further includes a fluid inlet passage 104, which in the illustrated embodiment includes a port 111 through the housing opening to a header 112 and thereafter a fluid inlet opening 114 to the microporous fluid channels 103.

The port and the header can be formed in various ways and configurations. For example, port 111 may be positioned on top, as shown, side or end regions of the heat exchanger, as desired. Port 111 and header 112 are generally of a larger cross sectional area than opening 114, so that a mass flow of fluid can be communicated substantially without restriction to opening 114.

Although only a single fluid inlet opening 114 is shown, there may be one or more fluid inlet openings providing communication from the header to the fluid microchannels 103.

Fluid inlet opening 114 may open to microchannels 103 opposite the heat spreader plate such that fluid passing through the opening may pass between walls 110 toward surface 102a, before being diverted along the axial length of the channels, which extend parallel to axis x. Since most installations will position the heat spreader plate as the lowermost, as determined by gravity, component of heat exchanger 100, the fluid inlet openings 114 can generally be described as being positioned above the microchannels 103 such that fluid may flow through opening 114 down into the channels in a direction orthogonal relative to the plane of surface 102a and towards surface 102a and then change direction to pass along the lengths of channels 103 substantially parallel to surface 102a and axis x. Such direction change is driven by impingement of fluid against surface 102a.

Fluid inlet opening 114 may be positioned adjacent to the known intended heat generating component contact region 102b since this region of the heat spreader plate may be exposed to greater inputs of thermal energy than other regions on plate 102. Positioning the fluid inlet opening adjacent region 102b seeks to introduce fresh heat exchanging fluid first and directly to the hottest region of the heat exchanger. The position, arrangement and/or dimensions of opening 114 may be determined with consideration of the position of region 102b such that opening 114 may be placed adjacent, for example orthogonally opposite to, or according to the usual mounting configuration above, the intended heat generating component contact region 102b on the heat plate. The delivery of fresh fluid first to the region that is in direct communication with the heat generating component to be cooled seeks to create a uniform temperature at the contact region as well as areas in the heat spreader plate away from the contact region.

In the illustrated embodiment, opening 114 is positioned to have its geometric center aligned over the center, for example the geometric center, of region 102b. It is noted that it may facilitate construction and installation by intending, and possibly forming, the heat sink spreader plate to be installed with the heat generating component positioned on the plate substantially centrally, with respect to the plate's perimeter edges, and then opening 114 may be positioned also with its geometric center substantially centrally with respect to the perimeter edges of the heat spreader plate. In this way, the geometric center points of each of opening 114, the heat spreader plate and the heat generating component may all be substantially aligned, as at C.

Opening 114 may extend over any channel 103 through which it is desired that heat exchange fluid flows. Openings 114 may take various forms including, for example, various shapes, various widths, straight or curved edges (in plane or in section) to provide fluid flow features, open area, etc., as desired.

Heat exchanger 100 further includes a fluid outlet passage 106, which in the illustrated embodiment includes one or more fluid outlet openings 124 from the microporous fluid channels 103, a header 126 and an outlet port 128 opening from the housing. Although two fluid outlet openings 124 are shown, there may be one or more fluid outlet openings providing communication to the header from the fluid channels 103.

The port and the header can be formed in various ways and configurations. For example, port 128 may be positioned on top, as shown, side or end regions of the heat exchanger, as desired.

Fluid outlet openings 124 may be positioned at the end of microchannels 103. Alternately or in addition, as shown, fluid outlet openings 124 may create an opening opposite heat spreader plate 102 such that fluid passing through the channels pass axially along the length of the channels between walls 110 and then changes direction to pass away from surface 102a out from between the walls 110 to exit through openings 124. Since most installations will position the heat spreader plate as the lowermost, as determined by gravity, component of heat exchanger 100, the fluid outlet openings 124 will generally be positioned above the microchannels 103 such that fluid may flow from the channels upwardly through openings 124.

Fluid outlet openings 124 may be spaced from fluid inlet openings 114 so that fluid is forced to pass through at least a portion of the length of channels 103 where heat exchange occurs before exiting the microchannels. Generally, fluid outlet openings 124 may be spaced from the known intended heat generating component contact region 102b.

In the illustrated embodiment, where heat exchanger 100 is intended to be mounted with heat source 107 generally centrally positioned relative to the perimeter edges of heat spreader plate 102, and thereby the ends 103a of channels, openings 124 may be positioned at or adjacent channel ends 103a.

At least one opening 124 extends over any channel 103 through which it is desired that heat exchange fluid flows. Openings 124 may take various forms including, for example, various shapes, various widths, straight or curved edges (in plane or in section) to provide fluid flow features, open area, etc. as desired.

Fluid inlet opening 114 may open away from the ends of the microchannels, for example along a length of a microchannel between its ends. In this way, fluid is introduced to a middle region of a continuous channel 103 rather than fluid being introduced to one end of a channel and allowing it to flow the entire length of the channel. In the illustrated embodiment, heat exchanger 100 is intended to be mounted with heat source 107 generally centrally positioned relative to the perimeter edges of heat spreader plate 102. As such, in the illustrated embodiment, opening 114 is positioned generally centrally relative to the edges of the heat plate 102. Since the channels, in the illustrated embodiment extend substantially continuously along the length of the heat plate between opposing side perimeter edges thereof, opening 114 opens generally centrally between ends 103a of each channel. For example, opening 114 may be positioned in the middle 50% of the heat exchanger or possibly the middle 20% of the heat exchanger. The delivery of fresh fluid to the central region where the heat generating component is in direct communication with the heat spreader plate, first before passing through the remaining lengths of channels seeks to create a uniform temperature at region 102b as well as areas in the heat spreader plate adjacent to the intended mounting position. The introduction of fluid to a region along a middle region of the microchannels after which the flow splits into two sub flows to pass outwardly from the inlet towards a pair of outlets, each of which is positioned at the ends of the channels reduces the pressure drop of fluid passing along the channels over that pressure drop that would be created if the fluid passed along the entire length of each channel. Splitting the fluid flow to allow only approximately one half of the mass inlet flow to pass along any particular region of the microchannels creates less back pressure and less flow resistance, allows faster fluid flow through the channels and lessens the pump force required to move the fluid through the heat exchanger.

In use, heat spreader plate 102 is positioned in thermal communication with heat source 107 at region 102b. Heat generated by heat source 107 is conducted up through heat spreader plate 102 to surface 102a and walls 110. Heat exchanging fluid, as shown by arrows F, enters the fluid heat exchanger through port 111, passes into the header 112 and through opening 114. The heat exchanging fluid then passes down between walls 110 into channels 103, where the fluid accepts thermal energy from the walls 110 and surface 102a. The heat exchanging fluid, after passing down into the channels, then impinges against surface 102a to be diverted toward ends 103a of the channels toward outlet openings 124. In so doing, in the illustrated embodiment, the fluid is generally split into two subflows moving away from each other and away from inlet 114 toward openings 124 at the ends of the microchannels. Fluid passing through channels becomes heated, especially when passing over the region in direct contact with the heat source, such as, in the illustrated embodiment, the central region of the heat spreader plate. Heated fluid passes out of openings 124, into header and thereafter through port 128. The heated fluid will circulate through a heat sink where its thermal energy is unloaded before circulating back to port 111.

The individual and relative positioning and sizing of openings 114 and 124 may allow fluid to circulate through the heat exchanging channels 103 while reducing the pressure drop generated in fluid passing through heat exchanger 100, when compared to other positionings and sizings. In the illustrated embodiment, for example, the central region 124a of outlet openings 124 are scalloped to offer an enlarged outlet region from the centrally located channels, relative to those on the edges. This shaping provides that the outlet openings from some centrally positioned channels 103, relative to the sides of the heat exchanger, are larger than the outlet openings from other channels closer to the edges. This provides that fluid flowing through the more centrally located channels encounters less resistance to flow therethrough, again facilitating flow past the central mounting region 102b on heat spreader plate 102.

A seal 130 separates fluid inlet passage 104 from fluid outlet passage 106 so that fluid must pass through the microporous channels 103 past heat spreader plate surface 102a.

Figure 4:
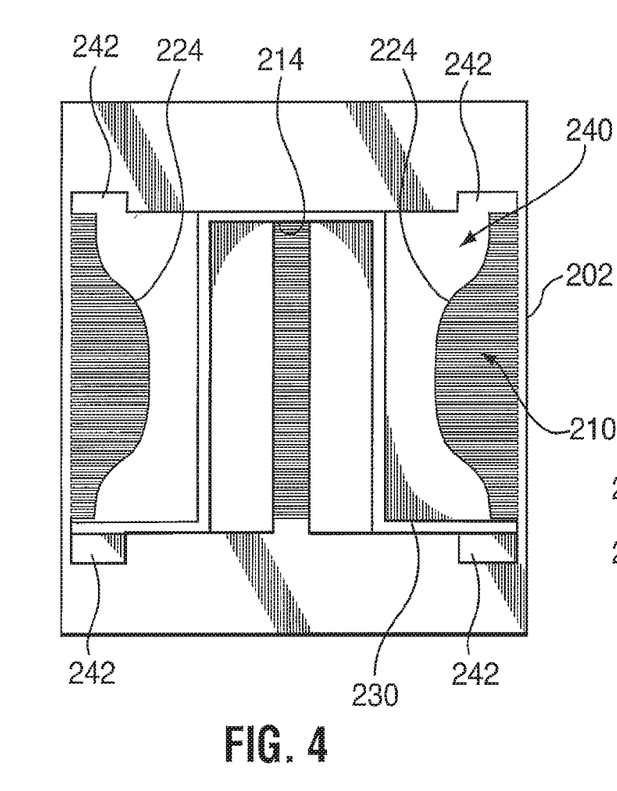
FIG. 4 is a top plan view of the fluid heat exchanger of FIG. 5 assembled with its top cap removed.
Figure 5:
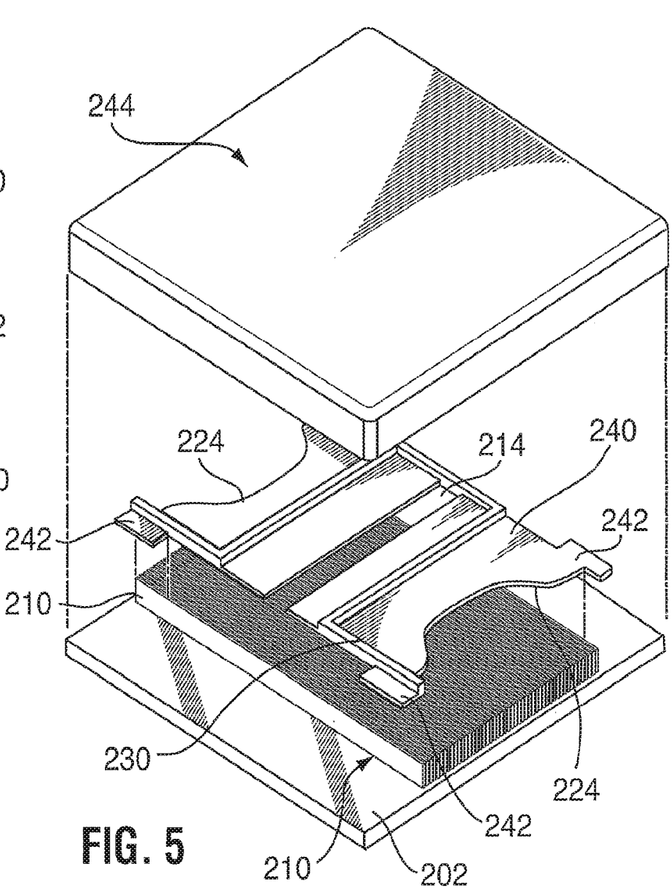
FIG. 5 is an exploded, perspective view of a fluid heat exchanger according to another embodiment of the invention.

With reference to FIGS. 4 and 5, a useful method for manufacturing a fluid heat exchanger is described. A heat spreader plate 202 may be provided which has heat conductive properties through its thickness at least about a central region thereof.

Microchannels may be formed on the surface of the heat spreader plate, as by adding walls or forming walls by building up or removing materials from the surface of the heat plate. In one embodiment, skiving is used to form walls 210.

A plate 240 may be installed over the walls 210 to close off the channels across the upper limits of walls 210. Plate 240 has portions removed to create inlet and outlet openings 214 and 224, respectively, in the final heat exchanger. Tabs 242 may be used to assist with the positioning and installation of plate 240, wherein tabs 242 are bent down over the two outermost walls.

Seal 230 may be installed as a portion of plate 240 or separately.

After plate 240 and seal 230 are positioned, a top cap 244 can be installed over the assembly. Top cap 244 can include side walls that extend down to a position adjacent heat spreader plate.

The parts may be connected during assembly thereof or afterward by overall fusing techniques. In so doing, the parts are connected so that short circuiting from inlet passage to outlet passage is substantially avoided, setting up the fluid circuit as described herein above wherein the fluid flows from opening 214 to openings 224 through the channels defined between walls 210.

The previous description of the disclosed embodiments is provided to enable any person skilled in the art to make or use the present invention. Various modifications to those embodiments will be readily apparent to those skilled in the art, and the generic principles defined herein may be applied to other embodiments without departing from the spirit or scope of the invention. Thus, the present invention is not intended to be limited to the embodiments shown herein, but is to be accorded the full scope consistent with the claims, wherein reference to an element in the singular, such as by use of the article "a" or "an" is not intended to mean "one and only one" unless specifically so stated, but rather "one or more". All structural and functional equivalents to the elements of the various embodiments described throughout the disclosure that are know or later come to be known to those of ordinary skill in the art are intended to be encompassed by the elements of the claims. Moreover, nothing disclosed herein is intended to be dedicated to the public regardless of whether such disclosure is explicitly recited in the claims. No claim element is to be construed under the provisions of 35 USC 112, sixth paragraph, unless the element is expressly recited using the phrase "means for" or "step for".

I claim:

1. A fluid heat exchanger for cooling an electronic device, the heat exchanger comprising:
    a plurality of walls defining a corresponding plurality of microchannels, wherein each microchannel extends from a first end to a second end;
    a plate defining an inlet opening, and a pair of surfaces flanking the inlet opening, wherein the plate is positioned over the walls, wherein the inlet opening extends transversely relative to each of the plurality of microchannels and is configured to distribute a coolant among the plurality of microchannels, wherein a first outlet opening and a second outlet opening are positioned opposite each other relative to the inlet opening, each outlet opening positioned above the plurality of microchannels;
    a housing overtop the plurality of walls and the plate, the housing so spaced from a first portion of the plate as to define a first gap positioned over the walls and between the housing and the plate, the housing so spaced from a second portion of the plate as to define a second gap positioned over the walls and between the housing and the plate, the housing defining an inlet port and an outlet port, wherein an inlet passage extends from the inlet port to the inlet opening, a portion of the inlet passage extending through the first gap positioned over the walls and between the housing and the plate, wherein an outlet passage extends from each of the first outlet opening and the second outlet opening to the outlet port, a portion of the outlet passage extending through the second gap positioned over the walls and between the housing and the plate; and
    a seal extending from the plate to the housing and separating the inlet passage from the outlet passage, wherein a flow of the coolant through the inlet opening bifurcates into two sub flows within each microchannel, wherein the first outlet opening receives one of the two sub flows and second outlet opening receives the other of the two sub flows, wherein the two sub flows recombine in the outlet passage.

2. The fluid heat exchanger according to claim 1, wherein the inlet opening defined by the plate opens to the plurality of microchannels between the first end and the second end of each respective microchannel.

3. The fluid heat exchanger according to claim 2, wherein each microchannel in the plurality of microchannels has a middle region positioned between its first end and its second end, wherein the inlet opening defined by the plate is configured to introduce coolant to the middle region of each microchannel.

4. The fluid heat exchanger according to claim 2, wherein the inlet opening is positioned within the middle 50% of a length measured between the first end and the second end of each respective microchannel.

5. The fluid heat exchanger according to claim 1, wherein the plurality of microchannels comprises at least two opposed outer microchannels and a centrally located microchannel positioned between the opposed outer microchannels, wherein the first outlet opening is larger from the centrally located microchannel than from at least one of the outer microchannels.

6. The fluid heat exchanger according to claim 1, wherein the seal is a portion of the plate.

7. The fluid heat exchanger according to claim 1, wherein the plate and the seal comprise a unitary construct.

8. The fluid heat exchanger according to claim 1, wherein the surfaces urge against the walls, defining a flow boundary of the microchannels.

9. The fluid heat exchanger according to claim 1, wherein the first outlet opening is positioned adjacent the microchannel first ends and the second outlet opening is positioned adjacent the microchannel second ends.

* * * * *